(12) United States Patent
Lee et al.

(10) Patent No.: US 12,540,733 B2
(45) Date of Patent: Feb. 3, 2026

(54) COOKING APPARATUS

(71) Applicant: SAMSUNG ELECTRONICS CO., LTD., Suwon-si (KR)

(72) Inventors: Changhyun Lee, Suwon-si (KR); Yesil Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 934 days.

(21) Appl. No.: 17/735,465

(22) Filed: May 3, 2022

(65) Prior Publication Data

US 2022/0390120 A1 Dec. 8, 2022

Related U.S. Application Data

(63) Continuation of application No. PCT/KR2022/004390, filed on Mar. 29, 2022.

(30) Foreign Application Priority Data

| Jun. 3, 2021 | (KR) | ................. 10-2021-0072392 |
| Jul. 22, 2021 | (KR) | ................. 10-2021-0096687 |
| Oct. 15, 2021 | (KR) | ................. 10-2021-0137678 |

(51) Int. Cl.
*F24C 7/08* (2006.01)
*F24C 15/20* (2006.01)

(52) U.S. Cl.
CPC .............. *F24C 7/082* (2013.01); *F24C 15/20* (2013.01)

(58) Field of Classification Search
CPC ............. A47J 36/38; F24C 7/08; H05B 6/642
See application file for complete search history.

(56) References Cited

U.S. PATENT DOCUMENTS

| 8,028,438 B2 * | 10/2011 | Pedtke | ................. F24F 13/222 34/223 |
| 2021/0037619 A1 * | 2/2021 | Armstrong | ............. H05B 6/642 |

FOREIGN PATENT DOCUMENTS

| CN | 205783589 U | * 12/2016 | .............. F24C 15/14 |
| CN | 206626633 U | 11/2017 | |
| KR | 10-1997-0062503 | 9/1997 | |
| KR | 98-8918 | 4/1998 | |
| KR | 10-2004-0067641 | 7/2004 | |
| KR | 10-2006-0013842 | 2/2006 | |
| KR | 10-2007-0077984 | 7/2007 | |
| KR | 10-2008-0022795 | 3/2008 | |

(Continued)

OTHER PUBLICATIONS

International Search Report dated Jul. 19, 2022 in International Patent Application No. PCT/KR2022/004390 (4 pages; 3 pages English translation).

(Continued)

*Primary Examiner* — Steven W Crabb
*Assistant Examiner* — Spencer H. Kirkwood
(74) *Attorney, Agent, or Firm* — STAAS & HALSEY LLP

(57) ABSTRACT

A cooking apparatus includes a main body including a cooking chamber, and a control assembly mounted on a front side of the main body. The control assembly includes a case, a suction grille coupled to an upper portion of the case and including a cooling air inlet communicating with the outside, and a guide member arranged inside the case to be spaced apart from a rear surface of the case, the guide member provided to guide moisture introduced into the suction grille away from interior of the main body.

13 Claims, 17 Drawing Sheets

(56) References Cited

FOREIGN PATENT DOCUMENTS

| KR | 10-2013-0001251 | | 1/2013 | |
| KR | 20130001251 A | * | 1/2013 | |
| KR | 10-2015-0062578 | | 6/2015 | |
| WO | WO-2011099312 A1 | * | 8/2011 | .............. F24C 15/14 |

OTHER PUBLICATIONS

Korean Office Action dated Jul. 21, 2025 for Korean Application No. 10-2021-0137678.

* cited by examiner

COOKING APPARATUS

CROSS-REFERENCE TO RELATED APPLICATION(S)

This application is based on and claims priority under 35 U.S.C. § 111(a), of International Patent Application No. PCT/KR2022/004390, filed on Mar. 29, 2022, which claims the benefit of priority to Korean Patent Applications No. 10-2021-0072392, filed on Jun. 3, 2021, No. 10-2021-0096687, filed on Jul. 22, 2021, and No. 10-2021-0137678, filed on Oct. 15, 2021 in the Korean Intellectual Property Office, the disclosure of which is incorporated by reference herein in their entireties.

BACKGROUND

Field

The disclosure relates to a cooking apparatus including an improved structure, and more particularly, to a cooking apparatus including a control unit including an improved structure.

Description of Related Art

A cooking apparatus is an appliance for heating and cooking a cooking object, such as food, and refers to a device capable of providing various functions related to cooking, such as heating, defrosting, drying, and sterilizing an object to be cooked. As such a cooking apparatus, an oven such as a gas oven or an electric oven, a microwave heating device (hereinafter referred to as a microwave), a gas range, an electric range, and an Over The Range (OTR), a gas grill or an electric grill.

The OTR is a microwave that incorporates a hood function for ventilation in the kitchen, and the OTR may cook food more conveniently and efficiently while minimizing installation space. The OTR may be located above a cooking apparatus such as a gas range or a cooktop.

The cooking apparatus may include a control unit including a circuit board mounted therein to electronically control the cooking apparatus. In addition, the control unit may include a bracket panel that protects the circuit board from the outside and blocks the introduction of moisture. However, when humidity or moisture flows into the inside of the control unit, the moisture may accumulate therein, which causes the mold.

Accordingly, the cooking apparatus may need a path for discharging humidity or moisture introduced therein to the outside of the control unit.

SUMMARY

In accordance with an aspect of the disclosure, a cooking apparatus includes a main body including a cooking chamber, and a control assembly mounted on an exterior of the main body. The control assembly includes a case, a suction grille couplable to an upper portion of the case, and including a cooling air inlet to suction air from an exterior of the cooking apparatus, into the case through the suction grille, and a guide member arranged inside the case and spaced apart from a rear surface of the case, the guide member provided to guide moisture from the suctioned air introduced through the suction grille away from an interior of the main body.

The guide member may include a blocking portion including an inclined surface inclined forward and away from the interior of the main body.

The control assembly may further include a circuit board, and a bracket panel couplable to a lower side of the guide member to allow the circuit board to be mountable to a rear side thereof, the bracket panel arranged spaced apart from a rear surface of the case.

The control assembly may further include a flow space formed between a front surface of the bracket panel and the rear surface of the case to allow the moisture introduced into the suction grille to flow downward through the guide member.

The case may further include an extension rib formed to extend from the rear surface of the case toward the bracket panel and arranged inside the flow space.

The extension rib may include at least one of an upper rib formed on an upper side of the case, a lower rib formed on a lower side of the case, and a middle rib formed between the upper rib and the lower rib.

The case may include a case partition plate formed to extend from the rear surface of the case toward the main body.

The control assembly may further include a flow space formed between a lower surface of the bracket panel and an upper surface of the case partition plate, the flow space provided to allow the moisture introduced into the suction grille to flow backward in a direction of the main body.

The main body may include a front plate including an opening communicating with the cooking chamber and a mounting portion provided at one side of the opening and to which the control assembly is mounted.

The case may include a case partition plate formed to extend toward the mounting portion of the front plate, and the front plate may include a guide groove recessed rearward to be spaced apart from the case partition plate so as to allow moisture flowing along the case partition plate to be discharged.

The front plate may include a communicator formed to allow an electronic equipment chamber inside the main body to communicate with the control assembly.

The cooling air inlet may correspond to a first cooling air inlet, and the front plate may further include a second cooling air inlet communicating with the first cooling air inlet to allow air introduced into the first cooling air inlet to flow into the interior of the main body.

Air introduced into the second cooling air inlet may flow into the electronic equipment chamber to cool the circuit board arranged in a rear portion of the control assembly.

The main body may include a circulation air inlet formed on a lower surface of the main body to allow polluted air to be suctioned into the main body, and a discharge panel detachably mounted on an upper portion of an outer housing of the main body to allow the suctioned polluted air to be filtered and discharged, the discharge panel in which a circulation air outlet is formed. The suction grille may be arranged in front of the discharge panel.

The main body may further include a cooling air outlet formed on an upper surface of the outer housing to allow the air introduced into the cooling air inlet of the suction grille to be discharged.

In accordance with another aspect of the disclosure, a cooking apparatus includes a main body including a cooking chamber and a front plate, and a control unit mounted on a front side of the front plate. The control unit includes a case with an open upper surface, a suction grille coupled to between the case and the front plate so as to cover an upper portion of the case, and including a cooling air inlet communicating with the outside, a bracket panel arranged between the front plate and the case and mounted to the front plate to be spaced apart from a rear surface of the case, and a guide member mounted to an upper portion of the bracket panel and including a blocking portion formed to be inclined to guide moisture introduced into the suction grille to a space between the case and the bracket panel.

The case may include a case partition plate spaced apart from the bracket panel on a lower side of the bracket panel and extending toward the front plate.

The control unit may further include a first flow space formed between a front surface of the bracket panel and a rear surface of the case, and a second flow space formed between a lower surface of the bracket panel and the case partition plate of the case. Moisture introduced into the suction grille may be discharged to the outside by sequentially flowing through the first flow space and the second flow space.

In accordance with another aspect of the disclosure, a cooking apparatus includes a main body including a cooking chamber, a door coupled to a front side of the main body to open and close the cooking chamber, and a control unit arranged on a rear side of the door and mounted to a front side of the main body. The control unit includes a case, a suction grille coupled to an upper portion of the case and arranged at one side of the door to be in parallel with the door, the suction grille including a cooling air inlet communicating with the outside, and a guide member arranged on a lower side of the suction grille and provided to allow moisture introduced through the suction grille to flow toward the rear surface of the case.

The control unit may further include a bracket panel mounted on a lower side of the guide member, and spaced apart from the rear surface of the case to form a flow space through which the moisture flows downward.

DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
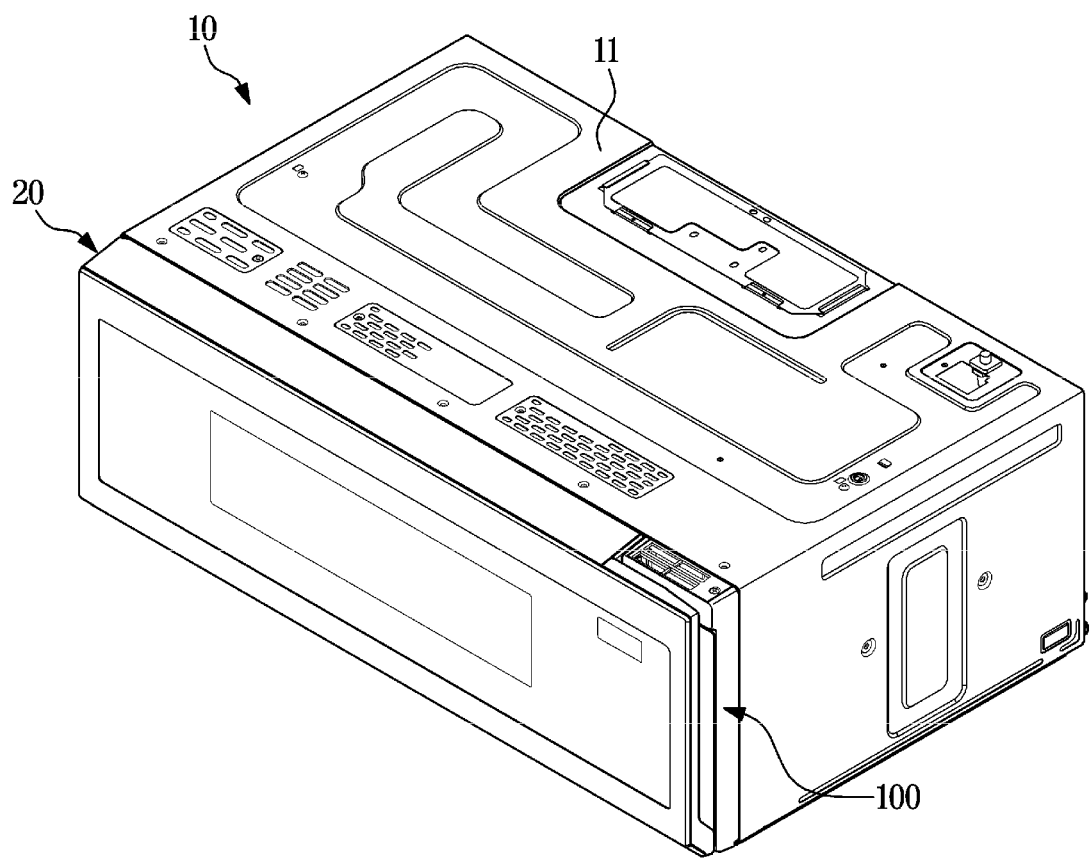
FIG. 1 is a perspective view illustrating a cooking apparatus according to an embodiment of the disclosure.

Embodiments described in the disclosure and configurations illustrated in the drawings are merely examples of the embodiments of the disclosure, and may be modified in various different ways at the time of filing of the present application to replace the embodiments and drawings of the disclosure.

In addition, the same reference numerals or signs illustrated in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Therefore, it is an aspect of the disclosure to provide a cooking apparatus capable of easily discharging moisture introduced into an interior of a control unit.

Additional aspects of the disclosure will be set forth in part in the description which follows and, in part, will be obvious from the description, or may be learned by practice of the disclosure.

Hereinafter an embodiment according to the disclosure will be described in detail with reference to the accompanying drawings.

Figure 2:
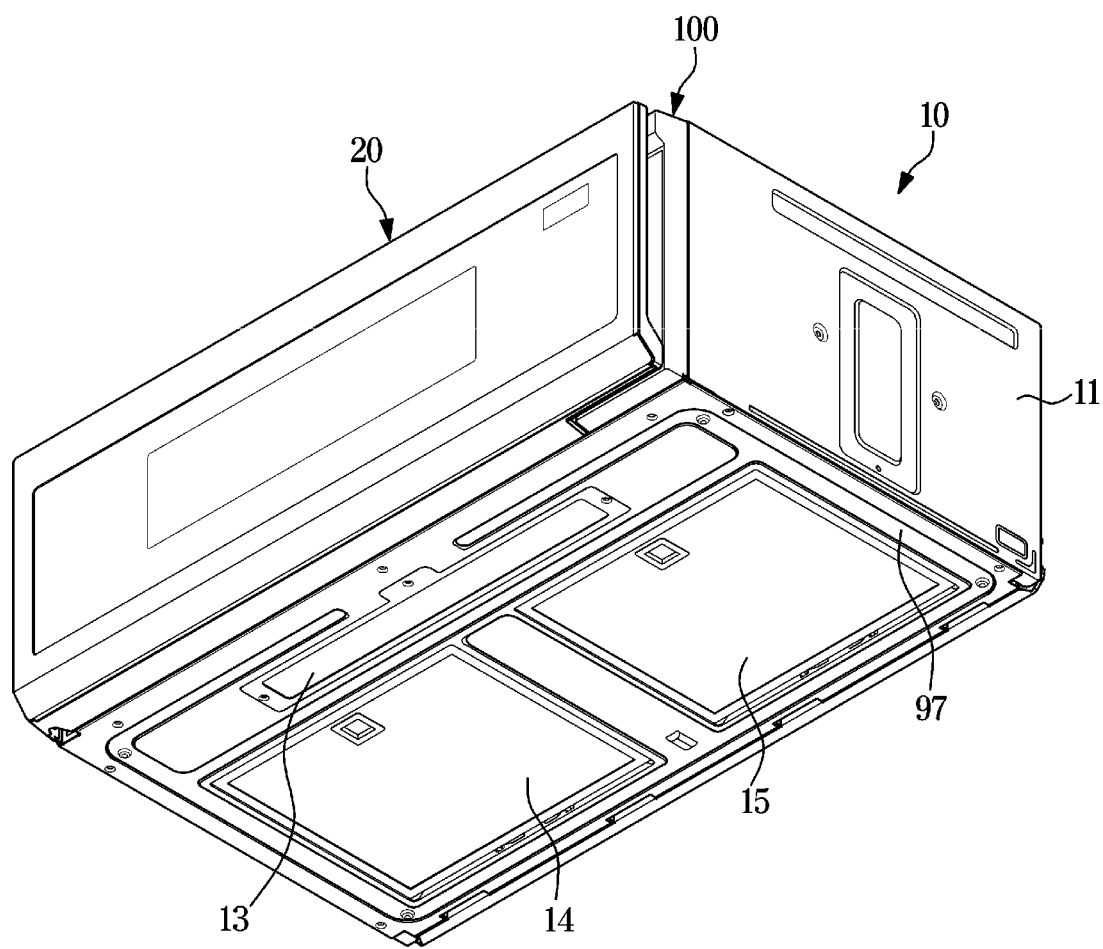
FIG. 2 is a bottom perspective view illustrating the cooking apparatus according to an embodiment of the disclosure.
Figure 3:
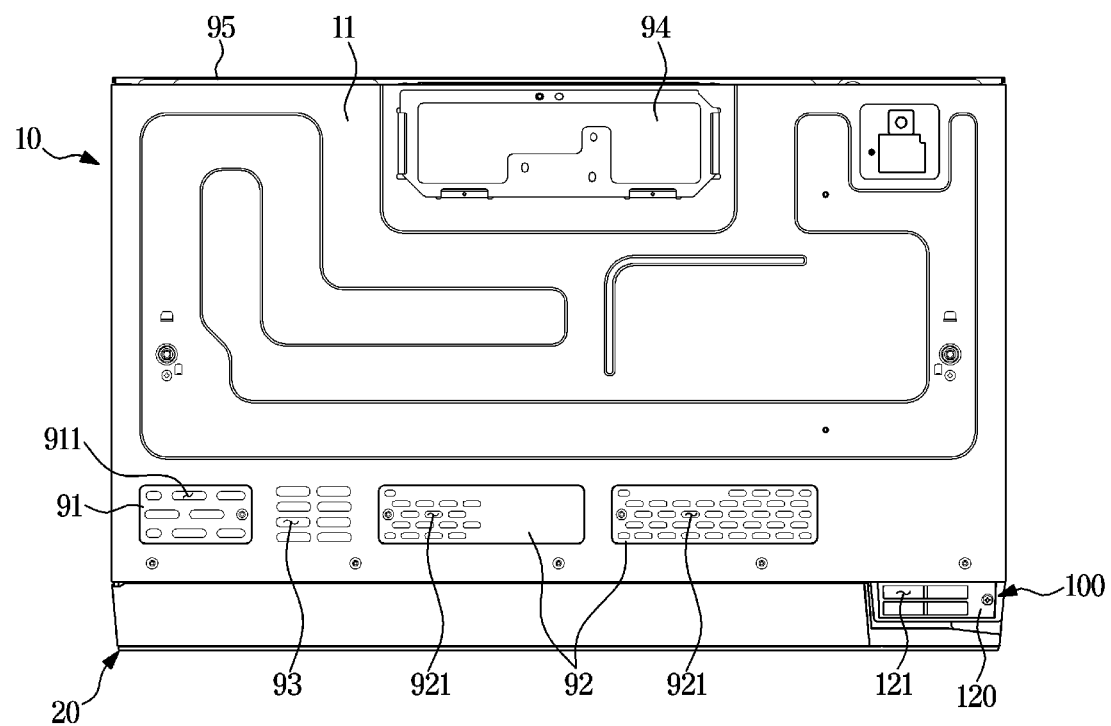
FIG. 3 is a top view illustrating the cooking apparatus according to an embodiment of the disclosure.

FIG. 1 is a perspective view illustrating a cooking apparatus according to an embodiment of the disclosure. FIG. 2 is a bottom perspective view illustrating the cooking apparatus according to an embodiment of the disclosure. FIG. 3 is a top view illustrating the cooking apparatus according to an embodiment of the disclosure.

A cooking apparatus 1 according to an embodiment of the disclosure may be provided as an oven the range (OTR). Hereinafter the cooking apparatus 1 will be described.

Referring to FIGS. 1 to 3, the cooking apparatus 1 may include a main body 10 and a door 20 coupled to a front side of the main body 10.

The cooking apparatus 1 may include a control unit 100 (also referred to as a control assembly 100) coupled to the front side of the main body 10. The front of the control unit 100 may be covered by the door 20. Particularly, the control unit 100 may be coupled to the main body 10 so as to be arranged between the door 20 and the main body 10.

A part of a rear portion of the door 20 may be recessed to cover the front of the control unit 100.

A first circulation air intake 14 and a second circulation air intake 15 may be formed on a lower surface of the main body 10. Particularly, the first circulation air intake 14 and the second circulation air intake 15 may be formed on a bottom plate 97 of the main body 10.

Oil vapor formed at a lower side of the cooking apparatus 1 may be sucked into the cooking apparatus 1 through the first circulation air intake 14 and the second circulation air intake 15. Particularly, the first circulation air intake 14 may include a first circulation air inlet. The second circulation air intake 15 may include a second circulation air inlet. The sucked oil vapor may be filtered by a filter (not shown) inside the cooking apparatus 1 and discharged to the outside of the cooking apparatus 1. Details of such a circulation flow path will be described later.

The main body 10 may include a lighting unit 13. The lighting unit 13 may be arranged in front of the first circulation air intake 14 and the second circulation air intake 15. The lighting unit 13 may be provided to irradiate light to the lower side of the cooking apparatus 1 in a state in which a cooktop is installed under the cooking apparatus 1.

A service panel 91 and a discharge panel 92 may be arranged on an upper surface of the main body 10. Particularly, the service panel 91 may be detachably mounted on the upper surface of an outer housing 11. The discharge panel 92 may be detachably mounted on an upper surface of the outer housing 11.

In addition, a ventilation duct panel 94 may be arranged on the upper surface of the main body 10. The ventilation duct panel 94 may be detachably mounted to the outer housing 11.

Although it is illustrated that two discharge panels 92 are formed according to an embodiment of the disclosure, the number of discharge panels 92 is not limited thereto.

The service panel 91 may include a first circulation air outlet 911. Each discharge panel 92 may include a second circulation air outlet 921.

The polluted air introduced into the main body 10 through the first circulation air intake 14 and the second circulation air intake 15 formed on the lower surface of the main body 10 may be filtered, and then discharged to the outside of the cooking apparatus 1 through the first circulation air outlet 911 and the second circulation air outlet 921.

In the description of the cooking apparatus 1 according to an embodiment of the disclosure described above, it has been described that the first circulation air outlet 911 and the second circulation air outlet 921 are formed in the service panel 91 and the discharge panel 92, and the filtered air is discharged into the indoor through the upper surface of the cooking apparatus 1.

However, the disclosure is not limited thereto, and in a state in which a separate communication duct (not shown) connected to the outdoor is provided in a space in which the cooking apparatus 1 is mounted, the service panel 91 may not include the first circulation air outlet 911, and the discharge panel 92 may also not include the second circulation air outlet 921.

Alternatively, a circulation air outlet may be formed in the ventilation duct panel 94. Accordingly, the oil vapor introduced into the first circulation air inlet and the second circulation air inlet may be filtered and flow to the communication duct through the ventilation duct panel 94 of a rear upper surface of the cooking apparatus 1, thereby being discharged to the outdoor.

In other words, the circulation air outlet is formed in the ventilation duct panel 94 while the first circulation air outlet 911 is not formed in the service panel 91 and the second circulation air outlet 921 is not formed in the discharge panel 92. Accordingly, all the filtered oil vapor may be discharged to the outdoor without being discharged to the indoor.

Accordingly, it is possible to keep the indoor air cleaner and because a temperature of cooling air introduced through a cooling flow path C, which will be described later, is lower, it is possible to increase the cooling efficiency of the cooking apparatus 1.

Further, because the service panel 91, the discharge panel 92 and the ventilation duct panel 94 are provided to be detachable in the outer housing 11, the service panel 91, the discharge panel 92, and the ventilation duct panel 94 may be mounted on the outer housing 11 as necessary.

Particularly, when it is required to discharge the filtered air to the indoor because the separate communication duct (not shown) is not provided, the service panel 91 and the discharge panel 92 including the circulation air outlet may be mounted on the outer housing 11, and the ventilation duct panel 94, in which the circulation air outlet is not formed, may be mounted on the outer housing 11.

Conversely, when it is not required to discharge the filtered air to the indoor because the separate communication duct (not shown) is provided, the service panel 91 and the discharge panel 92 in which the circulation air outlet is not formed respectively may be mounted on the outer housing 11 and the ventilation duct panel 94 including the circulation air outlet may be mounted on the outer housing 11.

The control unit 100 may be coupled to the front of the main body 10, and a suction grille 120 may be coupled to an upper side of the control unit 100.

The suction grille 120 may be arranged in front of the discharge panel 92. Particularly, the suction grille 120 may be accommodated in a recessed portion of the door 20, and the suction grille 120 may be arranged on one side of the door 20 to be in parallel with the door 20. In this case, the suction grille 120 may be arranged behind a part of the door 20.

Air outside the cooking apparatus 1 may be introduced into the main body 10 through the suction grille 120. The suction grille 120 may include a first cooling air inlet 121. Accordingly, air may be introduced through the first cooling air inlet 121 formed in the suction grille 120 to cool an electronic equipment chamber 60.

The air introduced through the suction grille 120 may cool the electronic equipment chamber 60 and then flow back into a cooking chamber 30 to cool a rear surface of the door 20 and then be discharged to a cooling air outlet 93 formed on the upper surface of the main body 10. Particularly, the cooling air outlet 93 may be formed by cutting a portion of the upper surface of the outer housing 11.

Figure 4:
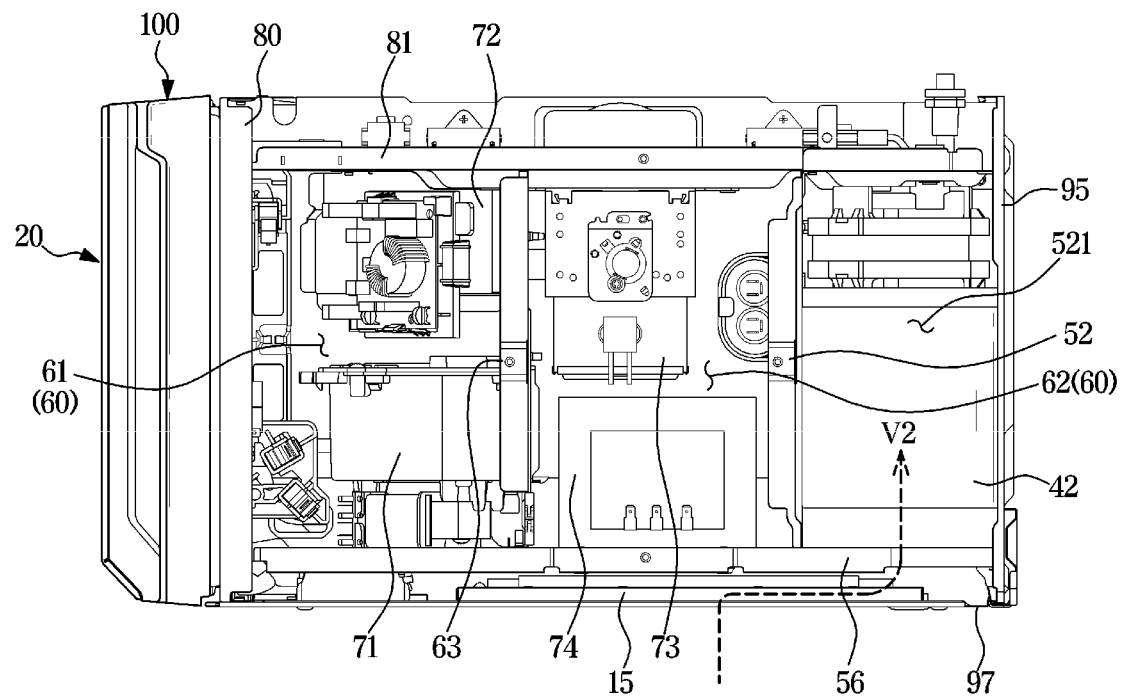
FIG. 4 is a side view illustrating one side of the cooking apparatus according to an embodiment of the disclosure in which an outer housing is removed.
Figure 5:
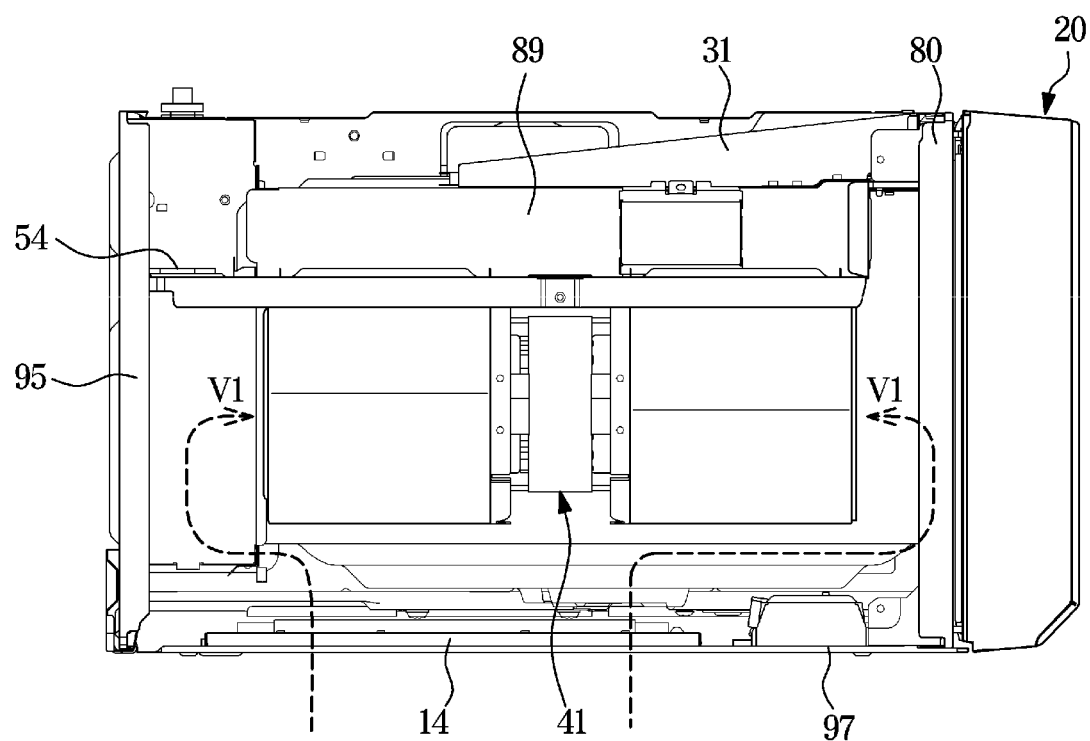
FIG. 5 is a side view illustrating the other side of the cooking apparatus according to an embodiment of the disclosure in which the outer housing is removed.

FIG. 4 is a side view illustrating one side of the cooking apparatus according to an embodiment of the disclosure in which an outer housing is removed. FIG. 5 is a side view illustrating the other side of the cooking apparatus according to an embodiment of the disclosure in which the outer housing is removed.

Referring to FIG. 4, the cooking apparatus 1 may include the electronic equipment chamber 60. Particularly, the electronic equipment chamber 60 may include a first electronic equipment chamber 61 and a second electronic equipment chamber 62.

An inner housing 12 of the main body 10 may include an upper plate 81 and a front plate 80.

The control unit 100 may be mounted to the front of the front plate 80. The first electronic equipment chamber 61 and the second electronic equipment chamber 62 may be provided at the rear of the front plate 80.

The electronic equipment chamber 60 may be provided to be partitioned in the inside of the main body 10 by the front plate 80, the upper plate 81, a cooling divider 51, and a circulation plate 56. Further, the electronic equipment chamber 60 may be divided into two parts by a partition plate 63 that defines the first electronic equipment chamber 61 and the second electronic equipment chamber 62. The cooling divider 51 may be provided as one surface of a rear bracket 52.

The circulation plate 56 may form a bottom surface of the electronic equipment chamber 60. The circulation plate 56 may be provided to be spaced apart from the bottom plate 97 of the outer housing 11.

The cooling divider 51 may be arranged above the circulation plate 56 to partition the electronic equipment chamber 60.

Because the electronic equipment chamber 60 is partitioned by the circulation plate 56 and the cooling divider 51, the oil vapor introduced through the second circulation air intake 15 formed on the lower surface of the main body 10 may not be introduced into the electronic equipment chamber 60. Accordingly, it is possible to protect components arranged inside the electronic equipment chamber 60 from oil vapor or other foreign substances.

A cooling fan 71 may be accommodated in the first electronic equipment chamber 61. The cooling fan 71 may form air flow to allow external air to be introduced into the suction grille 120.

In addition, as will be described later, because the control unit 100 is mounted on the front plate 80 to communicate with the first electronic equipment chamber 61, the air introduced into the suction grille 120 may cool the control unit 100. Details thereof will be described later.

A magnetron 73 and a transformer 74 may be accommodated in the second electronic equipment chamber 62. The magnetron 73 and the transformer 74 may be configured to generate a high frequency. The generated high frequency may be supplied to the inside of the cooking chamber 30 to heat the object to be cooked.

Hereinafter the cooling flow path C of the cooking apparatus 1 will be described.

The partition plate 63 provided to define the first electronic equipment chamber 61 and the second electronic equipment chamber 62 may be partially opened. The partition plate 63 may include a lower opening (not shown) communicating with the cooling fan 71 to allow air, which is sucked into the suction grille 120 by the cooling fan 71, to be introduced into the second electronic equipment chamber 62 through the first electronic equipment chamber 61. Further, the partition plate 63 may include an upper opening (not shown) through which the second electronic equipment chamber 62 and a guide duct 72 communicate.

The air introduced into the second electronic equipment chamber 62 may cool the transformer 74 and the magnetron 73, and then flow into the guide duct 72 mounted on the partition plate 63. The guide duct 72 may be arranged in the first electronic equipment chamber 61 to form a space in which the second electronic equipment chamber 62 and the cooking chamber 30 communicate.

Accordingly, the air flowing to the guide duct 72 may flow into the cooking chamber 30 to cool the rear surface of the door 20 during cooking. Thereafter, the air may flow into an exhaust duct 31 communicating with the upper surface of the cooking chamber 30, and be discharged to the outside of the cooking apparatus 1 through the cooling air outlet 93 communicating with the exhaust duct 31.

The cooking apparatus 1 may include circulation flow paths V1 and V2 sucking and filtering oil vapor, in addition to the cooling flow path C cooling the electronic equipment chamber 60 and the door 20.

The cooking apparatus 1 may include a second circulation fan 42 and the rear bracket 52. The rear bracket 52 may include a circulation fan receiver 521 provided to accommodate the second circulation fan 42.

A front portion of the circulation plate 56 may be closed to partition the electronic equipment chamber 60. However, the circulation plate 56 may be opened to communicate with a communicator 522 of the rear bracket 52. As the communicator 522 is formed in the circulation plate 56, the oil vapor may be introduced into the second circulation air intake 15 and filtered by a suction force generated by the second circulation fan 42.

Referring to FIG. 5, the cooking apparatus 1 may include a first circulation fan 41. The first circulation fan 41 may generate a suction force to allow air to be introduced into the first circulation air intake 14 formed in the bottom plate 97. A side plate 89 of the inner housing 12 may be mounted in an upper side of the first circulation fan 41. A portion of the side plate 89 may be cut to allow the introduced air to flow to the upper side of the first circulation fan 41.

Accordingly, the cooking apparatus 1 according to an embodiment of the disclosure may include the first circulation fan 41 and the second circulation fan 42 on opposite sides. Accordingly, a plurality of circulation flow paths V1 and V2 including a first circulation flow path V1 flowing by the first circulation fan 41 and a second circulation flow path V2 flowing by the second circulation fan 42 may be formed in the cooking apparatus 1. Details thereof will be described later.

Figure 6:
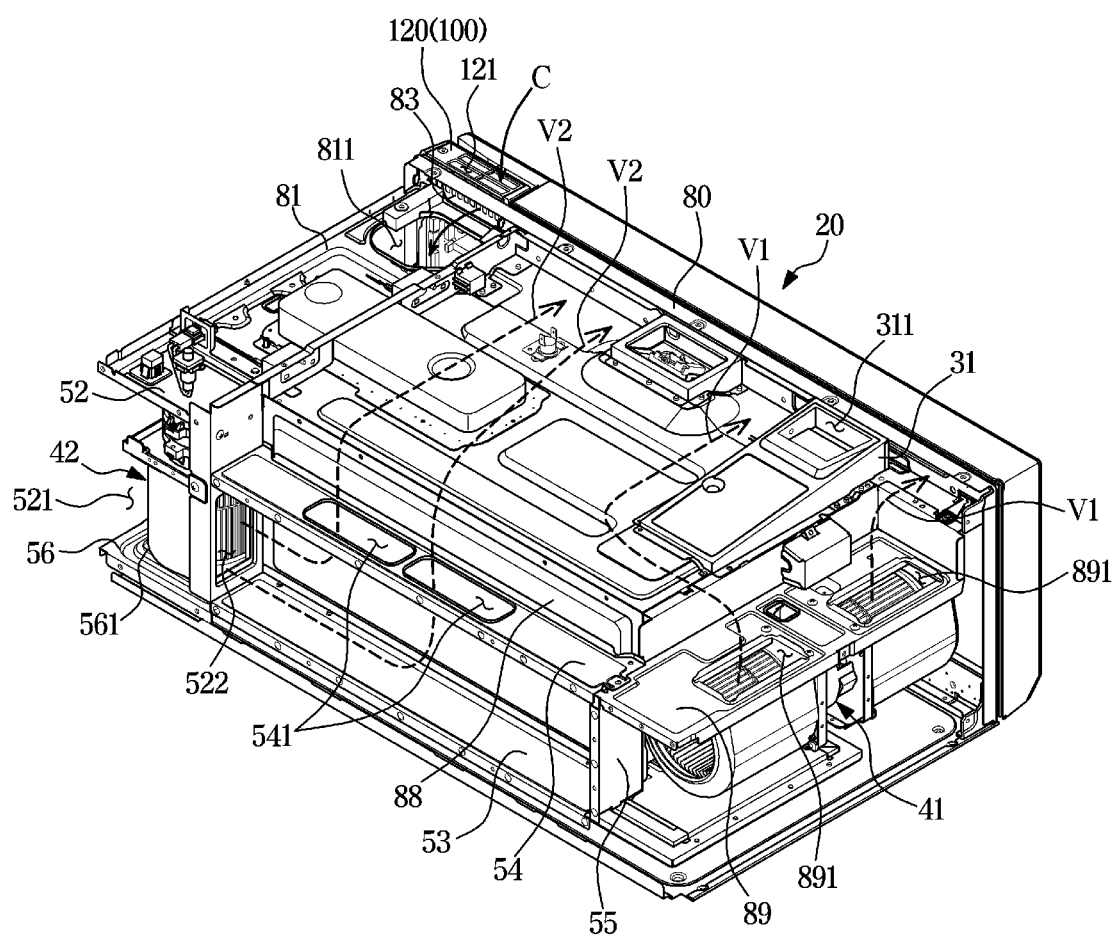
FIG. 6 is a rear perspective view illustrating air flow in a state in which the outer housing is removed from the cooking apparatus according to an embodiment of the disclosure.
Figure 7:
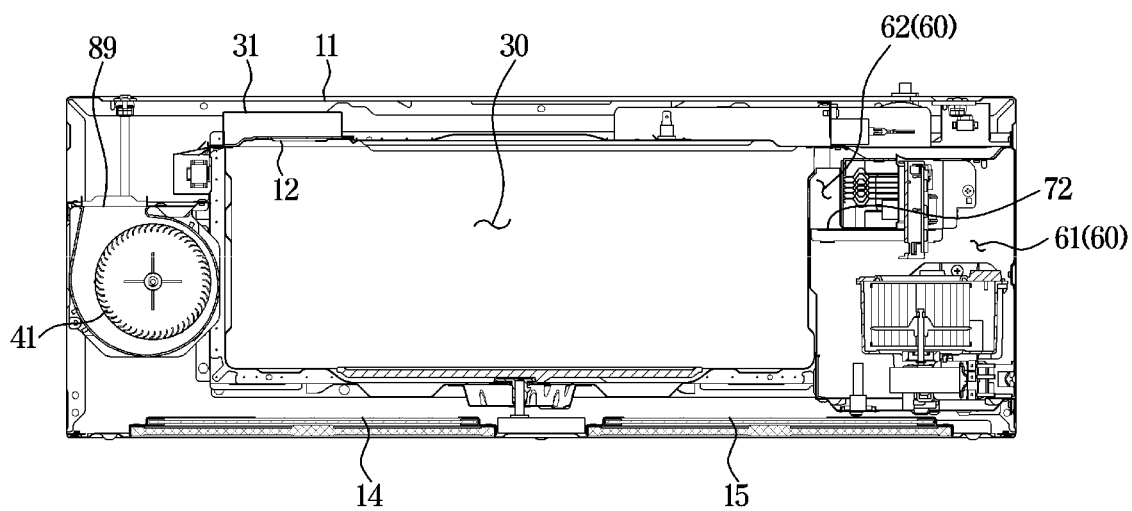
FIG. 7 is a cross-sectional view illustrating the cooking apparatus according to an embodiment of the disclosure.

FIG. 6 is a rear perspective view illustrating air flow in a state in which the outer housing is removed from the cooking apparatus according to an embodiment of the disclosure. FIG. 7 is a cross-sectional view illustrating the cooking apparatus according to an embodiment of the disclosure.

Hereinafter the first circulation flow path V1, the second circulation flow path V2, and the cooling flow path C according to an embodiment of the disclosure will be described.

Referring to FIGS. 5 and 6, air may be introduced into the main body 10 through the first circulation air intake 14 formed in the lower portion of the main body 10. The introduced air may be polluted air containing oil vapor.

The introduced air may be filtered and pass through the first circulation fan 41. The air passing through the first circulation fan 41 may flow to the side plate 89 arranged above the first circulation fan 41.

The side plate 89 may include a first communication hole 891. Air flowing the first circulation fan 41 through the first communication hole 891 may flow to the upper portion of the inner housing 12.

The flowing air may be discharged again to the outside of the cooking apparatus 1 through the first circulation air outlet 911 and the second circulation air outlet 921 formed in the front upper portion of the main body 10 as shown in FIG. 3. This may be referred to as the first circulation flow path V1.

Alternatively, in a state in which a separate communication duct is provided to discharge the filtered oil vapor to the outdoor, the air introduced into the first circulation air intake 14 may be discharged to the outside of the cooking apparatus 1 by passing through the circulation air outlet formed in the ventilation duct panel 94, as described above.

Referring to FIGS. 4 and 6, air may be introduced into the main body 10 through the second circulation air intake 15 formed at the lower portion of the main body 10. The introduced air may also be polluted air containing oil vapor.

The introduced air may be filtered and pass through the second circulation fan 42. Particularly, the air may be introduced into the circulation fan receiver 521 of the rear bracket 52 through a through hole 561 formed in the circulation plate 56.

The rear bracket 52 may include the communicator 522. The communicator 522 may be formed in a portion dividing between a back plate 95 of the outer housing 11 and the rear plate 88 of the inner housing 12. Therefore, the air introduced into the through hole 561 may flow to the rear of the inner housing 12 through the communicator 522.

The cooking apparatus 1 may include a bottom bracket 53, a partition bracket 54, and a circulation divider 55.

The bottom bracket 53 and the partition bracket 54 may be arranged between the outer housing 11 and the inner housing 12. Particularly, the bottom bracket 53 and the partition bracket 54 may be arranged at the rear of the inner housing 12 to extend horizontally. The bottom bracket 53 may be arranged under the partition bracket 54 to face the partition bracket 54.

The circulation divider 55 may be arranged between the outer housing 11 and the inner housing 12. Particularly, the circulation divider 55 may be arranged at the rear of the inner housing 12 and extend vertically. That is, the circulation divider 55 may be arranged to face the communicator 522 of the rear bracket 52.

The partition bracket 54 may include a second communication hole 541. The second communication hole 541 may be formed by cutting a part of the partition bracket 54. The second communication hole 541 may be provided to allow air to flow.

Accordingly, the rear bracket 52, the bottom bracket 53, the partition bracket 54, and the circulation divider 55 may be provided to form a part of a flow path through which the air introduced into the second circulation air intake 15 flows.

The air introduced into the second circulation air intake 15 may pass through the through hole 561 of the circulation plate 56, pass through the second circulation fan 42, pass through the communicator 522 of the rear bracket 52, and then flow between the bottom bracket 53 and the partition bracket 54.

In this case, the circulation divider 55 may be closed without an opening and arranged between the partition bracket 54 and the bottom bracket 53. Accordingly, the flowing air may flow to the rear upper side of the inner housing 12 through the second communication hole 541 of the partition bracket 54.

The air flowing to the upper side of the inner housing 12 through the second communication hole 541 may be discharged again to the outside of the cooking apparatus 1 through the first circulation air outlet 911 and the second circulation air outlet 921 formed in the front upper portion of the main body 10. This may be referred to as the second circulation flow path V2.

Alternatively, in a state in which a separate communication duct is provided to discharge the filtered oil vapor to the outdoor, the air introduced into the second circulation air intake 15 may be discharged to the outside of the cooking apparatus 1 by passing through the circulation air outlet formed in the ventilation duct panel 94, as described above.

Because the circulation divider 55 is provided to be closed, the air introduced by the first circulation fan 41 and the air introduced by the second circulation fan 42 may separately flow in the lower portion of the inner housing 12, and then mixed in the upper portion of the inner housing 12.

Referring to FIGS. 6 and 7, the air introduced into the suction grille 120 arranged on the upper portion of the control unit 100 may flow into the first electronic equipment chamber 61 and the second electronic equipment chamber 62 to cool various electric components. Particularly, the air introduced into the first cooling air inlet 121 of the suction grille 120 may be introduced into the inside of the main body 10 through the second cooling air inlet 83 of the front plate 80. Thereafter, the air may be introduced into the electronic equipment chamber 60 through a cutout 811 formed in the upper plate 81 of the inner housing 12.

The air introduced into the first electronic equipment chamber 61 may be introduced into the second electronic equipment chamber 62 through the cooling fan 71, and the air introduced into the second electronic equipment chamber 62 may be guided into the cooking chamber 30 by the guide duct 72 provided to communicate with a side surface of the cooking chamber 30. The air guided into the cooking chamber 30 may cool the rear surface of the door 20 and then flow to the exhaust duct 31 communicating with the upper surface of the cooking chamber 30. The exhaust duct 31 may be provided to communicate with the cooling air outlet 93. Accordingly, the air that completes the cooling may be discharged to the outside of the cooking apparatus 1 through the cooling air outlet 93. This may be referred to as the cooling flow path C.

Figure 8:
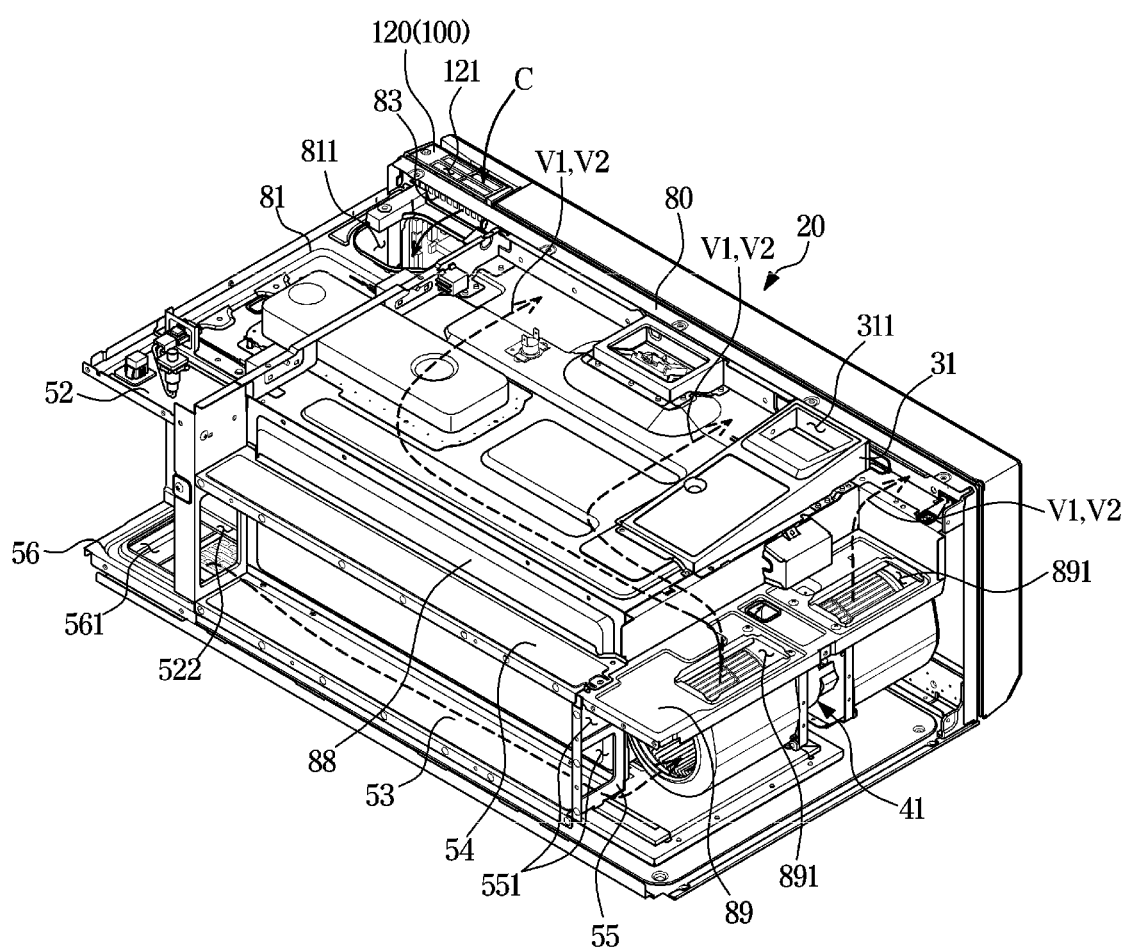
FIG. 8 is a rear perspective view illustrating air flow in a state in which an outer housing is removed from a cooking apparatus according to another embodiment of the disclosure.

FIG. 8 is a rear perspective view illustrating air flow in a state in which an outer housing is removed from a cooking apparatus according to another embodiment of the disclosure.

A cooking apparatus according to another embodiment of the disclosure may include a single circulation fan 41 unlike the cooking apparatus 1 according to an embodiment of the disclosure. Particularly, the cooking apparatus according to another embodiment may include only the first circulation fan 41.

Accordingly, the cooking apparatus according to another embodiment of the disclosure may form a single circulation flow path, unlike the cooking apparatus according to an embodiment of the disclosure.

Further, the cooking apparatus according to another embodiment of the disclosure includes the same configuration as the cooking apparatus 1 according to an embodiment of the disclosure, except that the configuration of the circulation divider 55 and the partition bracket 54 is different.

Therefore, this is the same as the above-described cooking apparatus 1, and thus the description thereof will be omitted, and the same components may include the same reference numerals.

The cooking apparatus according to another embodiment of the disclosure may include the first circulation fan 41 arranged between the inner housing 12 and the outer housing 11. Air may be sucked into the first circulation air inlet and the second circulation air inlet through the first circulation fan 41.

Particularly, the air introduced into the first circulation air inlet may pass through the first circulation fan 41 and pass through the first communication hole 891 of the side plate 89. The air passing through the first communication hole 891 may be discharged to the outside of the cooking apparatus through the first circulation air outlet 911 of the service panel 91 and the second circulation air outlet 921 of the discharge panel 92.

Alternatively, in a state in which a separate communication duct (not shown) is provided to discharge the filtered oil vapor to the outdoor, the air introduced into the first circulation air inlet may be discharged to the outside of the cooking apparatus 1 by passing through the circulation air outlet formed in the ventilation duct panel 94, as described above.

This may be provided in the same manner as the first circulation flow path V1 of the cooking apparatus 1 according to an embodiment of the disclosure.

However, the air introduced into the second circulation air inlet may pass through the through hole 561 of the circulation plate 56 and the communicator 522 of the rear bracket 52, and then flow into a space between the partition bracket 54 and the bottom bracket 53.

In this case, the partition bracket 54 may be provided to be closed without an opening. Particularly, unlike the cooking apparatus according to an embodiment of the disclosure, the second communication hole may not be formed in the partition bracket 54.

However, the partition bracket 54 may be closed and the second communication hole 551 may be formed in the circulation divider 55. Accordingly, the air introduced into the second circulation air inlet may flow into the space between the partition bracket 54 and the bottom bracket 53, pass through the second communication hole 551 of the circulation divider 55, and then flow to the first circulation fan 41.

Thereafter, the air passing through the first circulation fan 41 may flow to the upper portion of the inner housing 12 through the first communication hole 891 of the side plate 89. The flowing air may be discharged to the outside of the cooking apparatus through the first circulation air outlet 911 of the service panel 91 and the second circulation air outlet 921 of the discharge panel 92.

Alternatively, in a state in which a separate communication duct (not shown) is provided to discharge the filtered oil vapor to the outdoor, the air introduced into the second circulation air inlet may be discharged to the outside of the cooking apparatus 1 by passing through the circulation air outlet formed in the ventilation duct panel 94, as described above.

Accordingly, unlike the cooking apparatus 1 according to the embodiment of the disclosure, by closing the partition bracket 54 and by opening the circulation divider 55, the cooking apparatus according to another embodiment of the disclosure may suction air through the first circulation air inlet and the second circulation air inlet by using only the suction force of the first circulation fan 41.

Therefore, as the cooking apparatus is manufactured with a simpler structure, the manufacturing cost may be reduced. In addition, because it is possible to replace only the configuration of the partition bracket 54 and the circulation divider 55 according to the needs of the user, there is no need to change the internal design according to the number of circulation fans.

Figure 9:
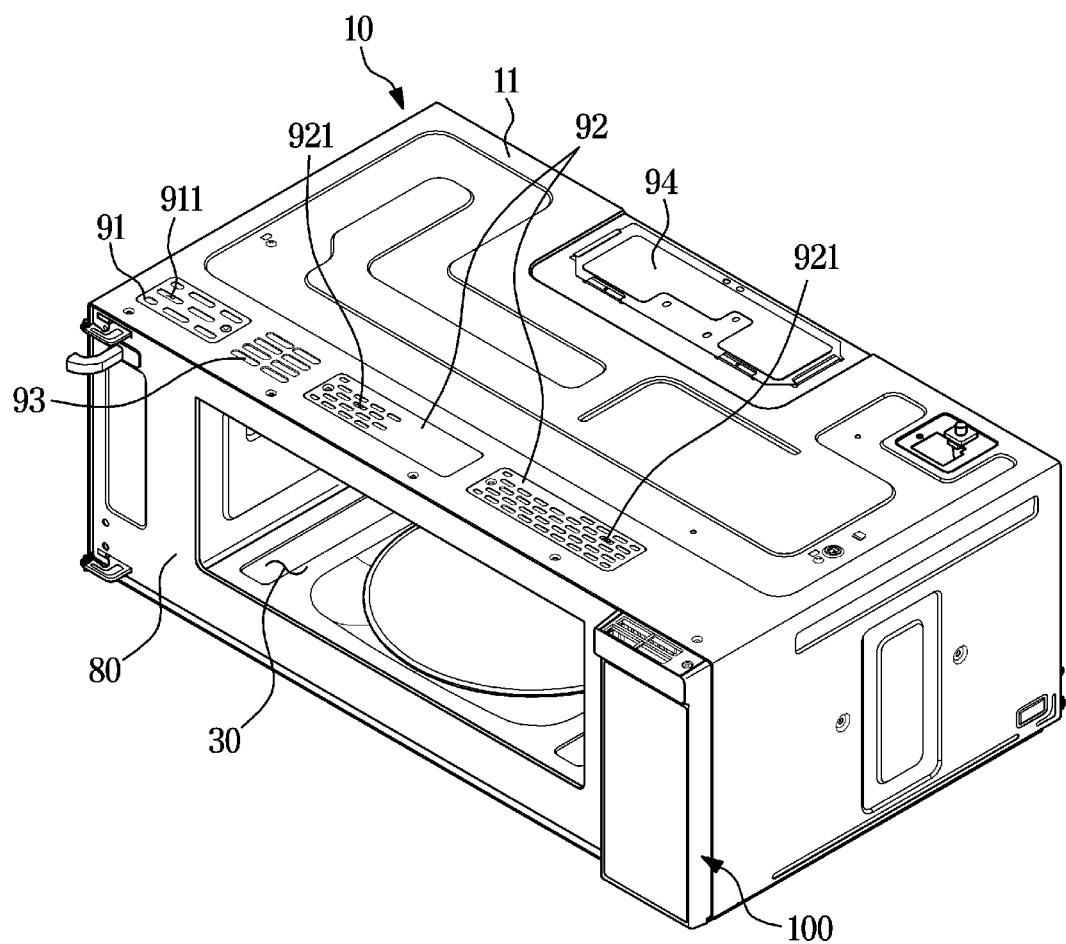
FIG. 9 is a view illustrating a state in which a control unit is coupled to a main body of the cooking apparatus according to an embodiment of the disclosure.
Figure 10:
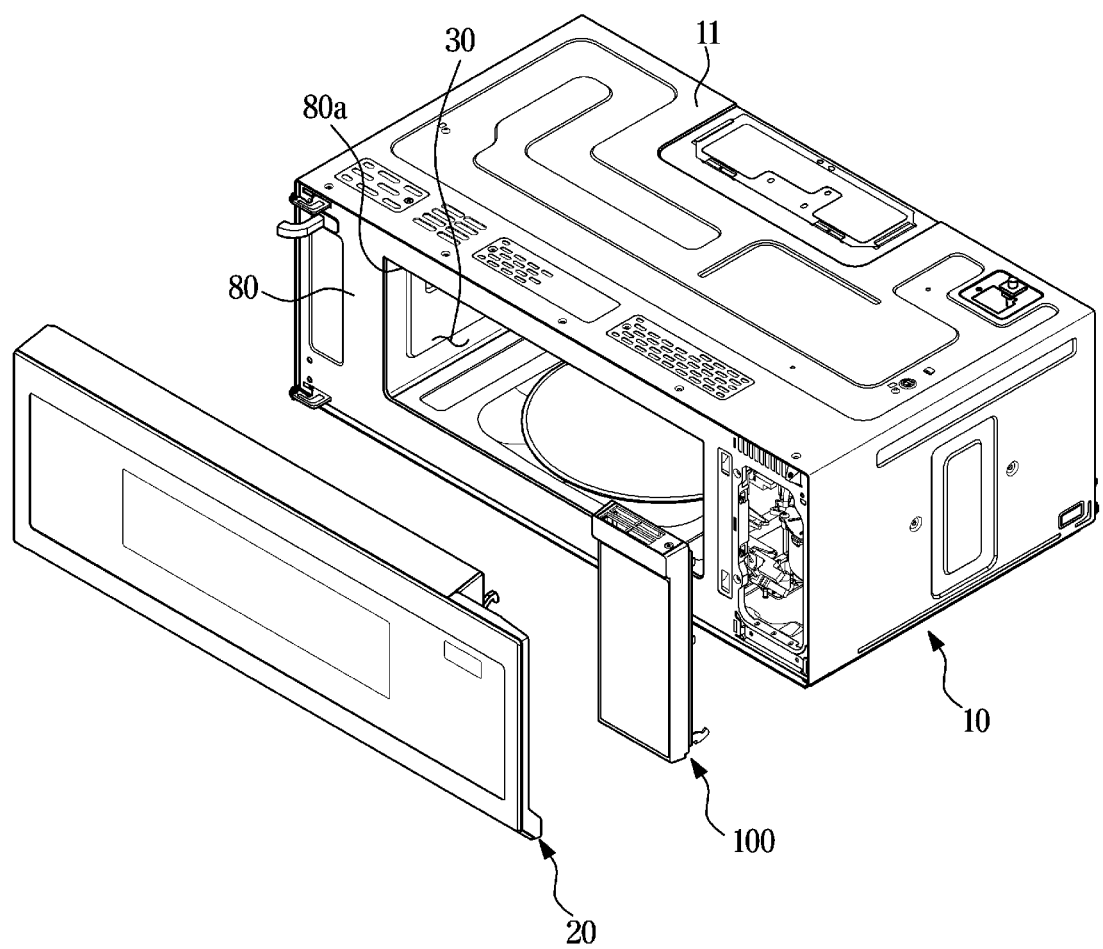
FIG. 10 is an exploded perspective view illustrating a door, the control unit, and the main body of the cooking apparatus according to an embodiment of the disclosure.
Figure 11:
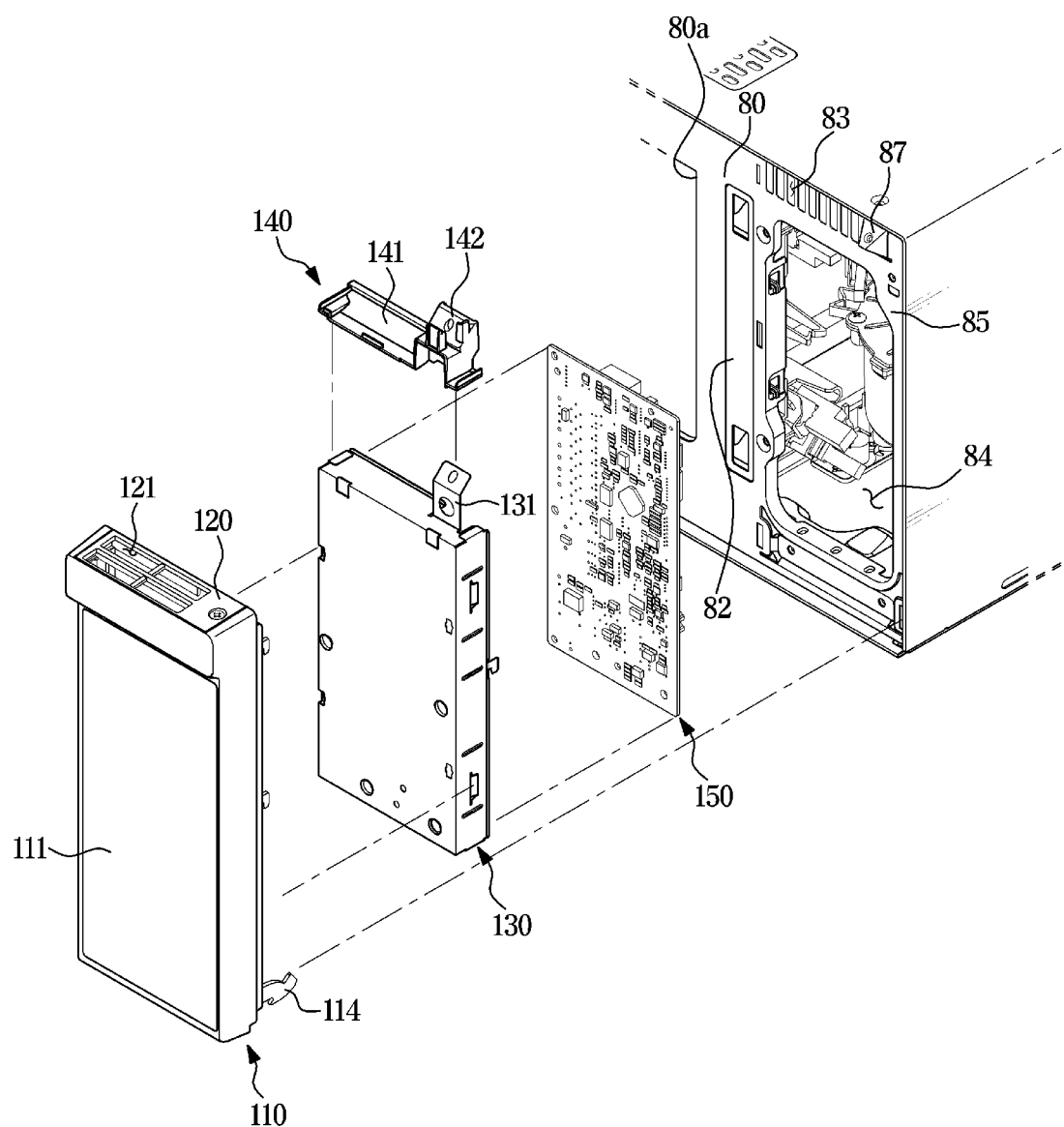
FIG. 11 is an enlarged-exploded perspective view illustrating the control unit and the main body of FIG. 10.

FIG. 9 is a view illustrating a state in which a control unit is coupled to a main body of the cooking apparatus according to an embodiment of the disclosure. FIG. 10 is an exploded perspective view illustrating a door, the control unit, and the main body of the cooking apparatus according to an embodiment of the disclosure. FIG. 11 is an enlarged-exploded perspective view illustrating the control unit and the main body of FIG. 10.

Referring to FIGS. 9 to 11, the control unit 100 may be mounted to the front side of the main body 10.

Particularly, the main body 10 may include the front plate 80. The front plate 80 may include an opening 80*a* communicating with the cooking chamber 30 and a mounting portion 85 provided at one side of the opening 80*a* to which the control unit 100 is mounted.

The front plate 80 may include a door fixer 82 provided between the opening 80*a* and the mounting portion 85. Particularly, the door fixer 82 may be provided to allow door latch (not shown) to be inserted thereinto so as to maintain a state, in which the door 20 closes the cooking chamber 30.

One side of the door 20 may be recessed inward from the rear to accommodate the control unit 100. Particularly, the door 20 may be rotatably coupled to the main body 10 so as to cover the front of the control unit 100. A user may open and close the door 20 through a handle formed between the control unit 100 and the door 20.

The control unit 100 may include a case 110 and the suction grille 120 mounted on an upper side of the case 110.

The case 110 and the suction grille 120 may be provided to form the exterior of the control unit 100. Particularly, the case 110 may be formed in such a way that an opening is formed on an upper surface thereof, and the suction grille 120 may be coupled to an upper portion of the case 110 so as to cover the opening of the case 110.

The case 110 may be provided in the shape of a box with an open rear surface. The case 110 may include a body 111. The case 110 may include an insertion leg 114 provided to extend to the rear of the body 111 so as to be inserted into an insertion hole of the mounting portion 85 of the front plate 80. The insertion leg 114 may extend from the rear of the case 110 toward the front plate 80. The insertion leg 114 may be provided in a substantially hook shape to allow the case 110 to be fixed to the front plate 80.

The suction grille 120 may include the first cooling air inlet 121 formed on the upper surface. The suction grille 120 may be screwed to a coupling boss (not shown) formed inside the case 110.

The control unit 100 may include a circuit board 150, a bracket panel 130 on which the circuit board 150 is mounted, and a guide member 140 mounted to an upper portion of the bracket panel 130.

The bracket panel 130 may be provided to be accommodated inside the case 110. The bracket panel 130 may be provided in the shape of a box with an open rear surface. The circuit board 150 may be accommodated inside the bracket panel 130. The circuit board 150 may be fixed to the inside of the bracket panel 130.

By the bracket panel 130, the circuit board 150 may be blocked from external impact or foreign substances.

The bracket panel 130 may include a guide mounting portion 131. A plurality of coupling holes may be formed in the guide mounting portion 131. The guide member 140 may be mounted to the guide mounting portion 131 of the bracket panel 130.

The guide mounting portion 131 may extend upward from an upper surface of the bracket panel 130. Particularly, the guide mounting portion 131 may extend upwardly of the bracket panel 130 and then be bent backward. The guide mounting portion 131 may be provided to correspond to the shape of the guide coupling portion 87 protruding from the front plate 80.

Accordingly, the guide mounting portion 131 may be provided to be coupled to the guide coupling part 87 of the front plate 80 while being coupled to the guide member 140.

The circuit board 150 may be provided to be accommodated in the rear of the bracket panel 130 and arranged in a communicator 84 of the front plate 80. In other words, the circuit board 150 may be provided to communicate with the first electronic equipment chamber 61. Therefore, cooling air may be introduced into the suction grille 120 to cool the components of the first electronic equipment chamber 61 while cooling the circuit board 150 together.

The guide member 140 may be mounted to an upper portion of the bracket panel 130. Particularly, the guide member 140 may be mounted on the guide mounting portion 131 of the bracket panel 130.

The guide member 140 may include a blocking portion 141 and a bracket mounting portion 142 provided on a lateral side of the blocking portion 141.

The blocking portion 141 may be provided to be inclined. Particularly, the blocking portion 141 may be provided to be inclined forward. In this case, an angle at which the blocking portion 141 is inclined may be appropriately provided to be about 5 degrees or less.

In response to the inclination angle of the blocking portion 141 being relatively large, a space occupied by the blocking portion 141 may be increased and a size of the second cooling air inlet 83 may be reduced. In addition, a length of the control unit 100 in a vertical direction may be increased and thus the size of the cooking apparatus may be increased.

In addition, in response to the inclined angle of the blocking portion 141 being relatively small, the moisture or foreign substances collected on the upper surface of the blocking portion 141 may flow to the second cooling air inlet 83 provided at the rear side, and enter the electronic equipment chamber without not being collected in one direction.

Accordingly, by providing the inclination angle of the blocking portion 141 being 5 degrees or less, the moisture or foreign substances may be efficiently guided to the outside of the control unit 100 without affecting cooling efficiency.

The blocking portion 141 may be provided to prevent the moisture or foreign substances, which are introduced from the first cooling air inlet 121 of the suction grille 120, from entering into the circuit board 150.

In addition, the blocking portion 141 may be provided to be inclined forward to prevent foreign substances from being introduced into the second cooling air inlet 83 at the rear side.

Alternatively, the blocking portion 141 may be provided to allow the moisture collected on the upper surface of the blocking portion 141 to flow toward the rear surface of the case 110 so as to be easily discharged to the outside of the control unit 100. Details thereof will be described later.

Figure 12:
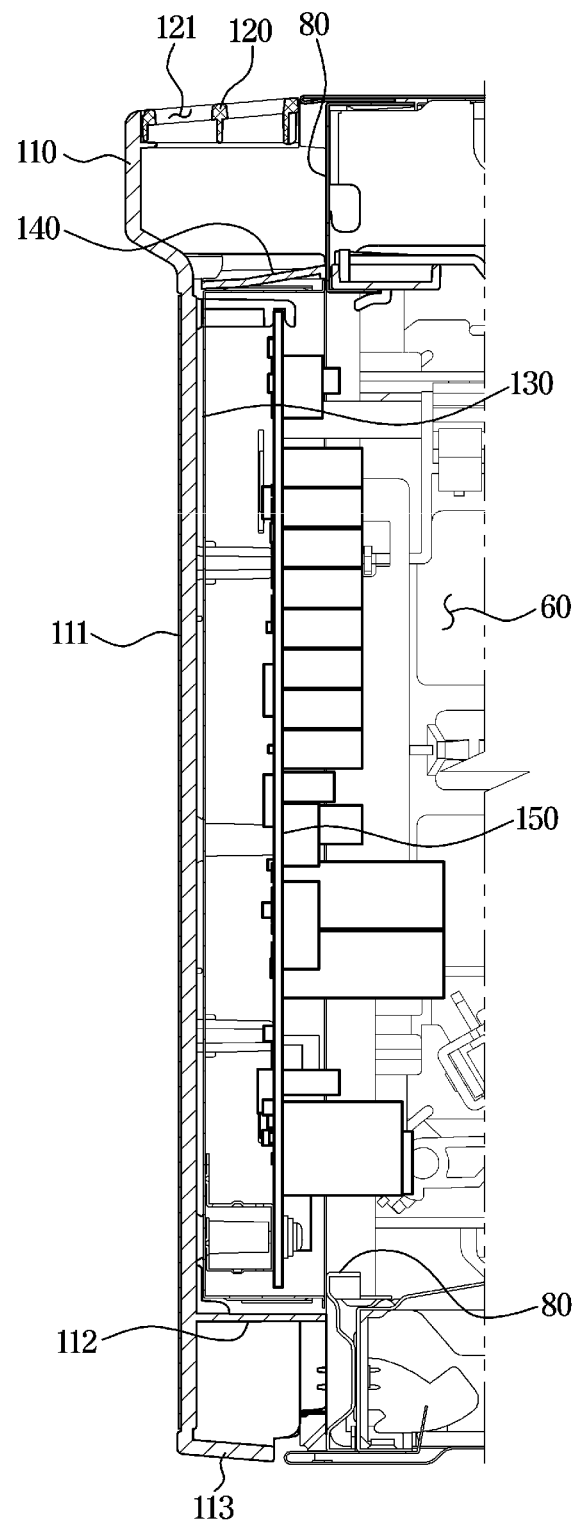
FIG. 12 is a cross-sectional view illustrating a state in which the control unit of the cooking apparatus is coupled to the main body according to an embodiment of the disclosure.
Figure 13:
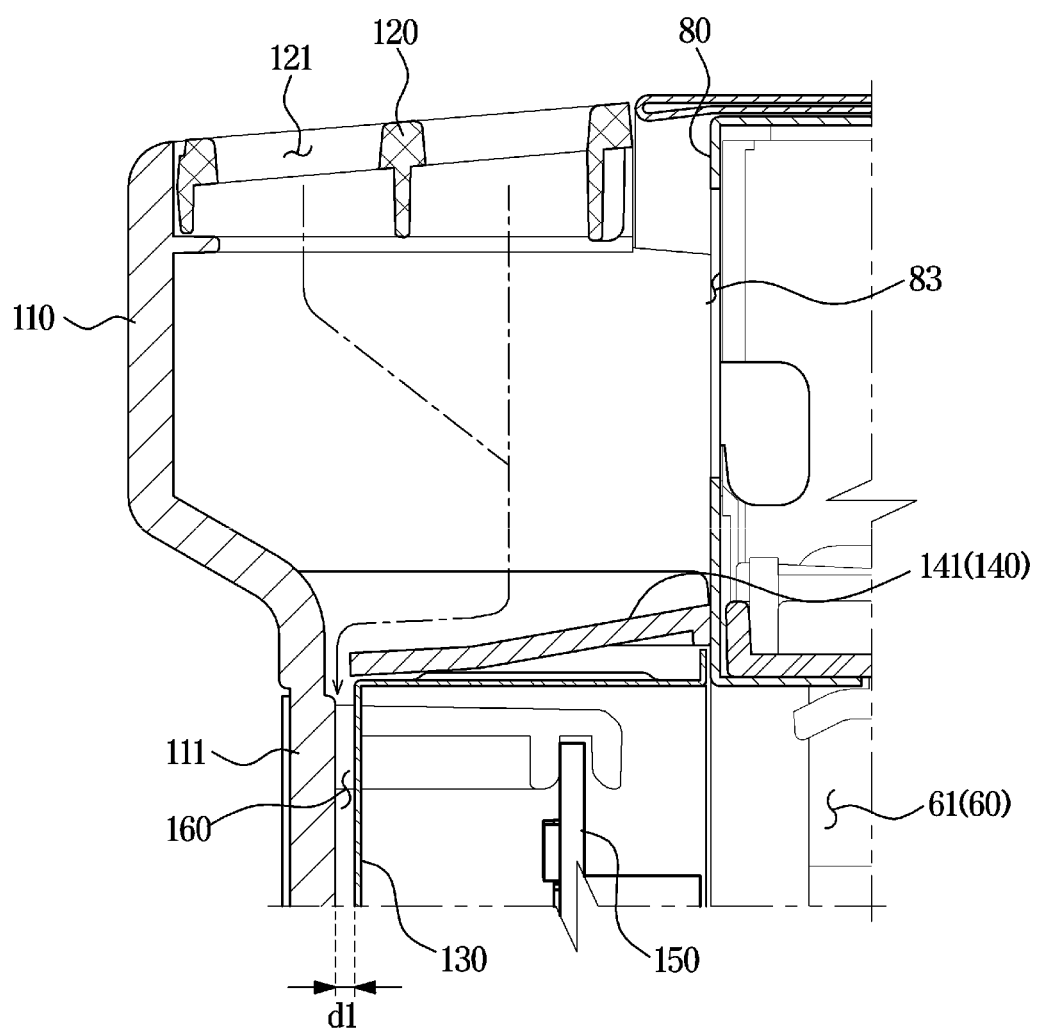
FIG. 13 is an enlarged cross-sectional view illustrating an upper part of FIG. 12.
Figure 14:
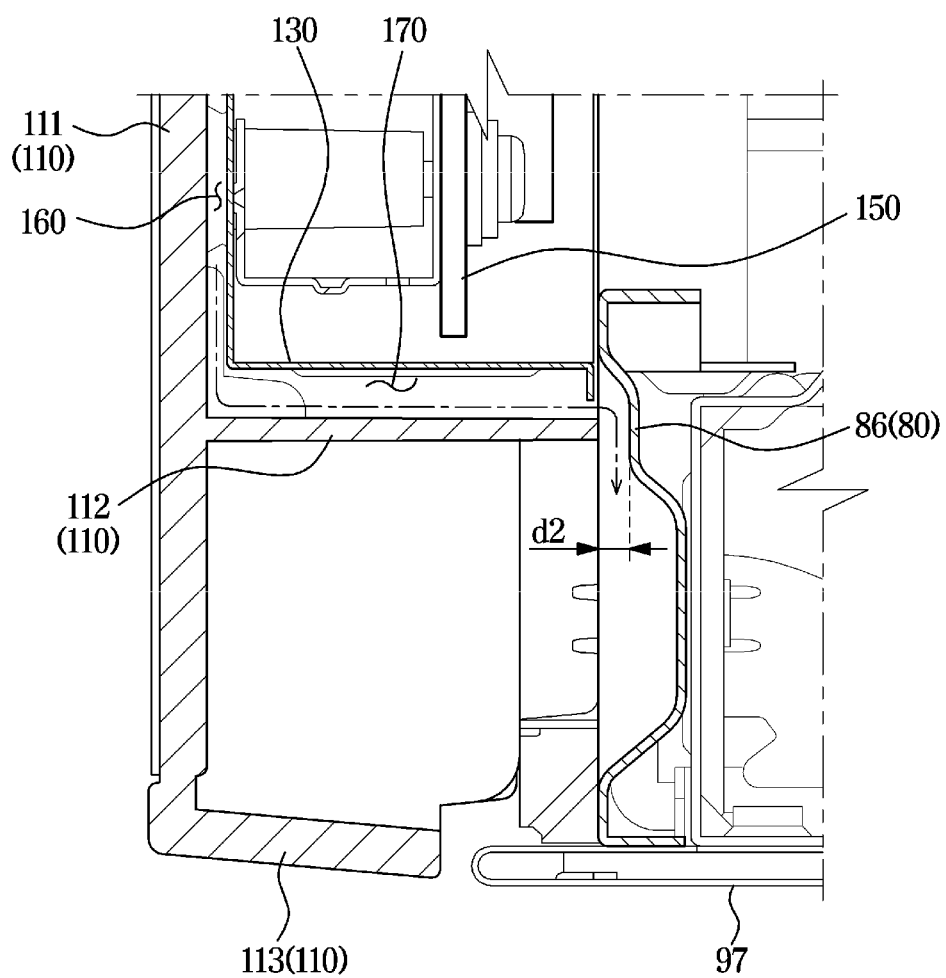
FIG. 14 is an enlarged cross-sectional view illustrating a lower part of FIG. 12.

FIG. 12 is a cross-sectional view illustrating a state in which the control unit of the cooking apparatus is coupled to the main body according to an embodiment of the disclosure. FIG. 13 is an enlarged cross-sectional view illustrating an upper part of FIG. 12. FIG. 14 is an enlarged cross-sectional view of a lower part of FIG. 12.

Referring to FIGS. 12 and 13, the case 110 of the control unit 100 may be provided to form a front exterior of the control unit 100.

The bracket panel 130 and the guide member 140 coupled to the upper portion of the bracket panel 130 may be provided at the rear of the case 110. The circuit board 150 may be fixed to the inside of the bracket panel 130. The circuit board 150 may be provided to be inserted into the front plate 80 to communicate with the electronic equipment chamber.

The suction grille 120 may be mounted on the upper portion of the case 110 to allow outside air to be introduced through the upper side of the control unit 100.

The guide member 140 may be arranged to be spaced apart from the rear surface of the case 110. The guide member 140 may be provided to guide the moisture introduced into the suction grille 120 to the front side. Particularly, because the blocking portion 141 of the guide member 140 includes an inclined surface inclined forward, the moisture introduced into the suction grille 120 may be guided to the front of the guide member 140.

The bracket panel 130 may be coupled to a lower side of the guide member 140.

The bracket panel 130 may be arranged to be spaced apart from the rear surface of the case 110. A space formed between the front surface of the bracket panel 130 and the rear surface of the case 110 may be provided as a first flow space 160.

A front and rear width d1 of the first flow space 160 may be approximately 1.3 mm. In other words, a separation distance d1 between the rear surface of the case 110 and the front surface of the bracket panel 130 may be approximately 1.3 mm.

The moisture introduced into the first cooling air inlet 121 of the suction grille 120 may flow downward through the first flow space 160 by passing through the guide member 140.

Referring to FIGS. 12 to 14, the case 110 may include a case partition plate 112 extending from the rear surface of the case 110 toward the main body 10. Particularly, the case partition plate 112 may extend from the rear surface toward the mounting portion 85 of the front plate 80.

An upper surface of the case partition plate 112 and a lower surface of the bracket panel 130 may be provided to be spaced apart from each other. A second flow space 170 may be formed between the upper surface of the case partition plate 112 and the lower surface of the bracket panel 130.

The moisture flowing downward through the first flow space 160 may flow into the second flow space 170. That is, the first flow space 160 and the second flow space 170 may be connected to each other.

An end portion of the case partition plate 112 may be provided to be spaced apart from the front plate 80. Particularly, the front plate 80 may include a guide groove 86 recessed rearward of the front plate 80 to be spaced apart from the case partition plate 112.

A separation distance d2 between the end portion of the case partition plate 112 and the guide groove 86 may be approximately 2.0 mm.

Accordingly, the moisture flowing downward through the first flow space 160 may flow along the second flow space 170 and flow in a separation space between the end portion of the case partition plate 112 and the guide groove 86 of the front plate 80.

In this case, a lower portion of the guide groove 86 of the front plate 80 may be recessed to be inclined forwardly to allow the flowing moisture to be easily discharged to a gap between a case bottom plate 113 and the bottom plate.

That is, the control unit 100 may include a flow path, in which the moisture introduced into the inside of the control unit 100 is easily discharged to the outside, by including the first flow space 160 and the second flow space 170 therein.

Accordingly, it is possible to ease a difficulty in which the moisture introduced through the first cooling air inlet 121 is collected on the upper surface of the guide member 140, which causes the generation of mold. Therefore, the usage satisfaction may be increased.

In addition, due to an external shock being applied to the cooking apparatus 1 in a state in which moisture is collected on the upper surface of the guide member 140, the collected moisture may flow into the circuit board 150 through the second cooling air inlet 83.

Therefore, the cooking apparatus 1 according to an embodiment of the disclosure may prevent moisture from accumulating inside the control unit 100 by leading to the completion of the discharge of the moisture as described above, thereby further improving the quality of the product.

Figure 15:
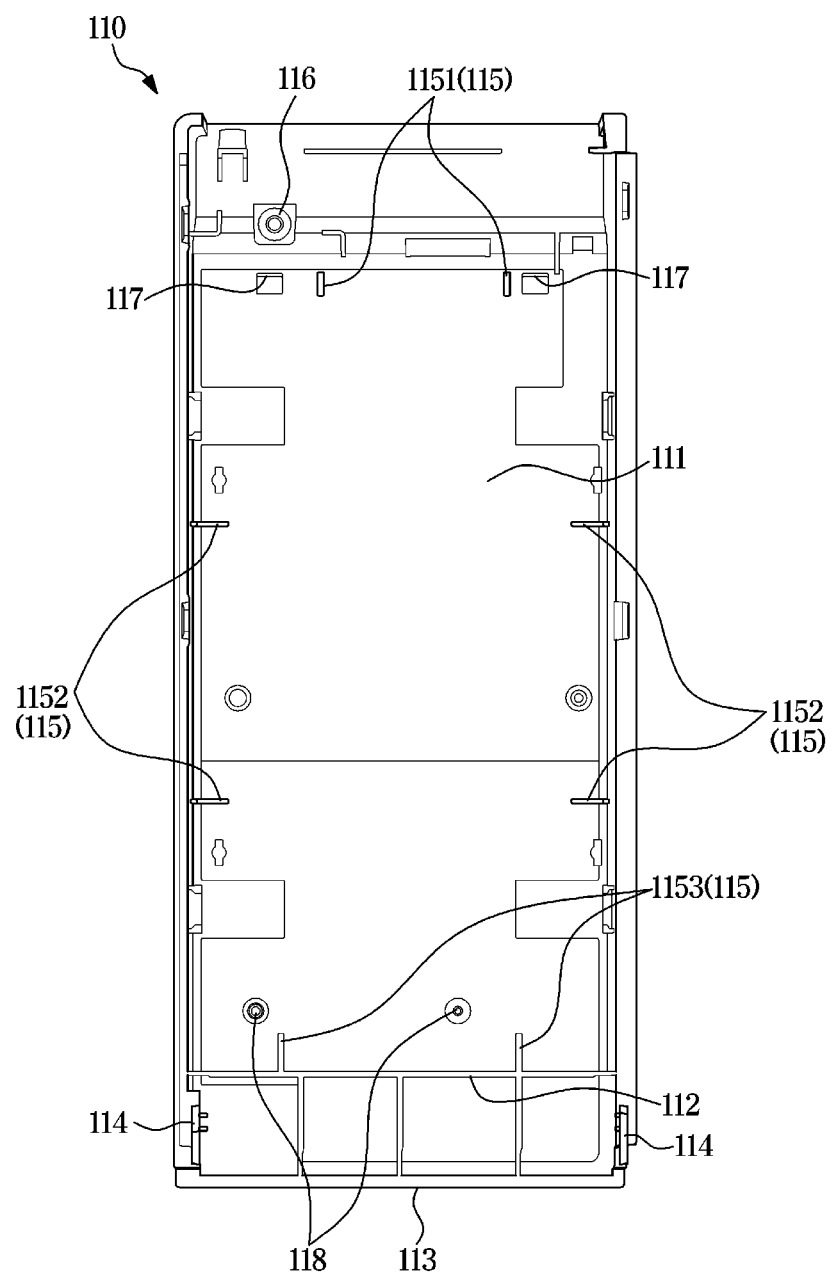
FIG. 15 is a view illustrating a rear surface of a case of the control unit illustrated in FIG. 11.
Figure 16:
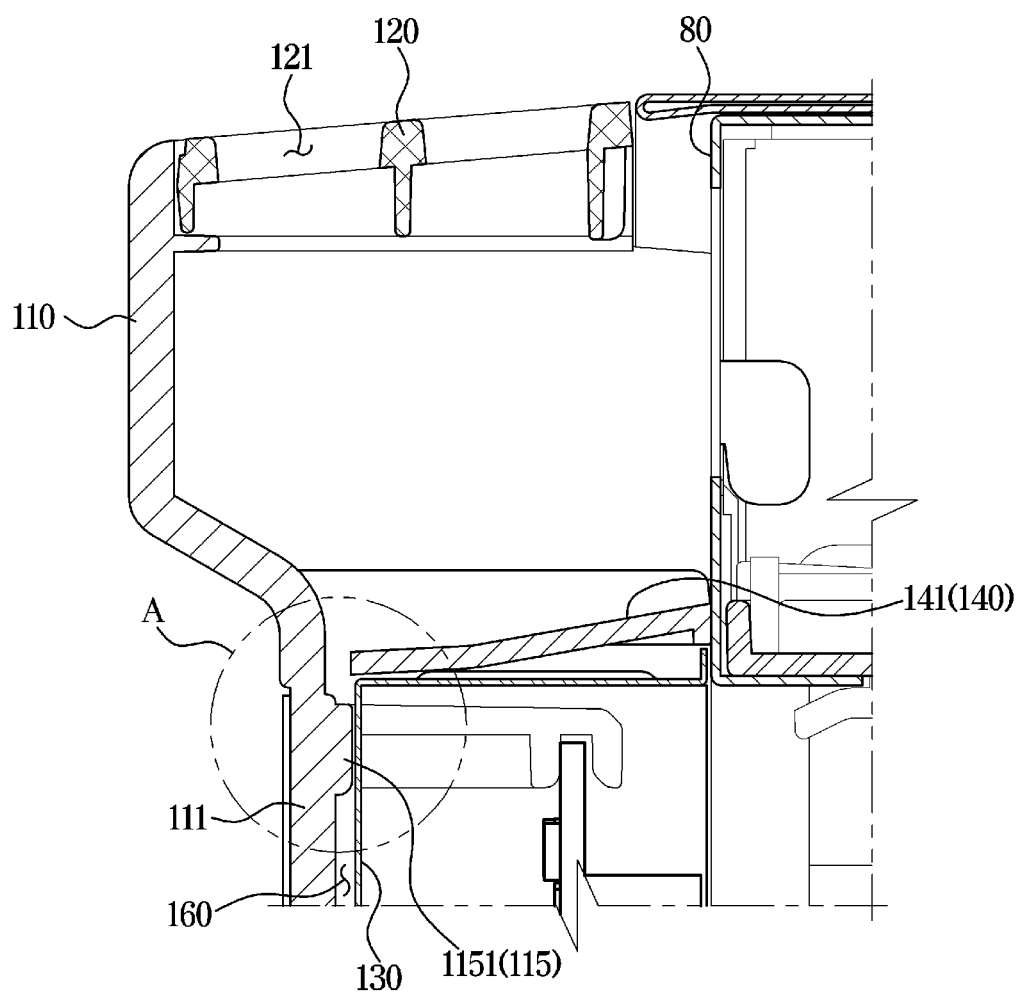
FIG. 16 is a cross-sectional view illustrating the control unit for an upper rib of the case illustrated in FIG. 15.
Figure 17:
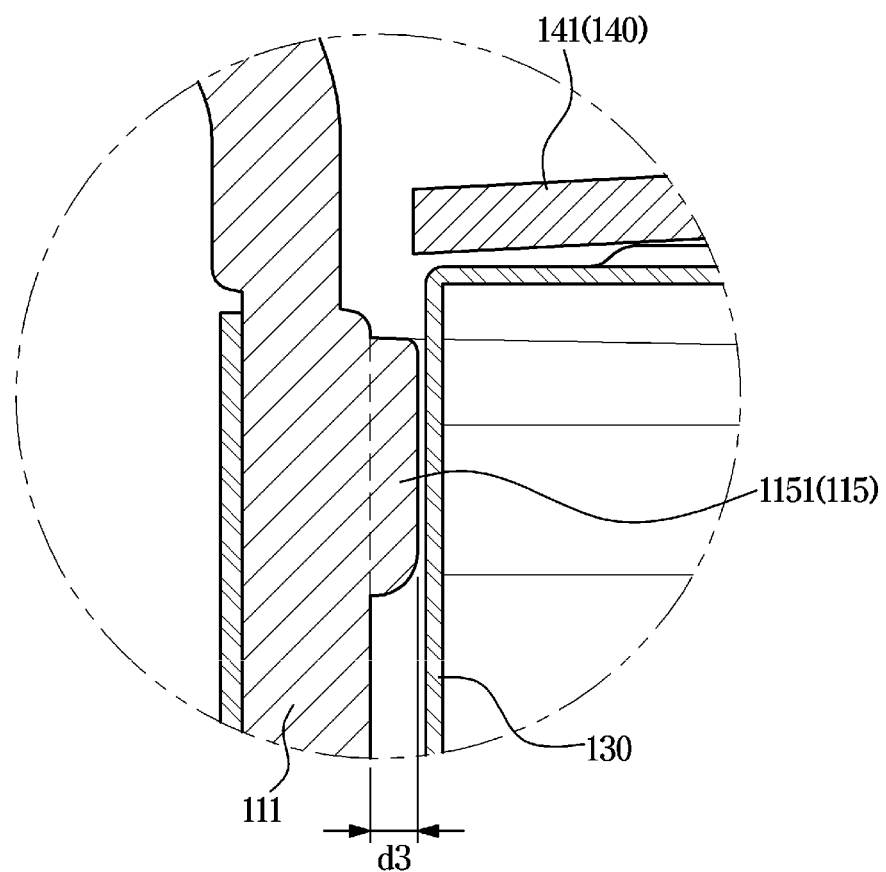
FIG. 17 is an enlarged view illustrating a part A of FIG. 16.

FIG. 15 is a view illustrating a rear surface of a case of the control unit illustrated in FIG. 11. FIG. 16 is a cross-sectional view illustrating the control unit for an upper rib of the case illustrated in FIG. 15. FIG. 17 is an enlarged view illustrating a part A of FIG. 16.

Referring to FIG. 15, the case 110 may include an extension rib 115 extending to protrude from the rear surface of the body of the case 110.

The extension rib 115 may be provided to maintain a state in which the front surface of the bracket panel 130 is spaced apart from the rear surface of the case 110. Particularly, the extension rib 115 may be provided to secure the first flow space 160 formed between the front surface of the bracket panel 130 and the rear surface of the case 110.

The extension rib 115 may include an upper rib 1151.

The upper rib 1151 may be formed on the upper side of the case 110. The upper rib 1151 may extend in a direction from the rear surface of the case 110 toward the bracket panel 130. FIG. 15 illustrates that the upper ribs 1151 is provided as a pair, but the number of the upper ribs 1151 is not limited thereto.

For example, a single upper rib 1151 may be provided instead of a plurality of upper ribs 1151, and three or more upper ribs 1151 may be provided.

The upper rib 1151 may be elongated from the upper side to the lower side of the case 110 and thus when the case 110 and the bracket panel 130 are assembled, the upper rib 1151 may maintain a gap between the rear surface of the case 110 and the front surface of the bracket panel 130. That is, the upper rib 1151 may have a shape extending in a vertical direction with respect to the case 110.

However, the shape of the upper rib 1151 may not be limited thereto. For example, the upper rib 1151 may have a shape extending from the left side to the right side of the case 110 and extending in a horizontal direction with respect to the case 110.

The extension rib 115 may include a middle rib 1152.

The middle rib 1152 may be formed in a middle portion of the case 110. The middle rib 1152 may extend from the rear surface of the case 110 toward the bracket panel 130. The middle rib 1152 may be arranged between the upper rib 1151 and a lower rib 1153.

FIG. 15 illustrates that the middle rib 1152 is provided as a pair at the same height, but the number of the middle ribs 1152 is not limited thereto.

For example, a single middle rib 1152 may be provided instead of a plurality of middle ribs 1152 at the same height, and three or more middle ribs 1152 may be provided.

In addition, FIG. 15 illustrates that the middle rib formed in the middle portion of the case 110 is formed in such a way that another pair of middle ribs 1152 are formed under a pair of middle ribs 1152.

However, the number of the pair of middle ribs 1152 may not be limited thereto. The single middle rib 1152 or the pair of middle ribs 1152 at the same height may be provided between the upper rib 1151 and the lower rib 1153 to be described later.

The middle rib 1152 may be elongated from the upper side to the lower side of the case 110 and thus when the case 110 and the bracket panel 130 are assembled, the middle rib 1152 may maintain a gap between the rear surface of the case 110 and the front surface of the bracket panel 130. That is, the middle rib 1152 may have a shape extending in the vertical direction with respect to the case 110.

However, the shape of the middle rib 1152 may not be limited thereto. For example, the middle rib 1152 may have a shape extending from the left side to the right side of the case 110 and extending in the horizontal direction with respect to the case 110.

The extension rib 115 may include the lower rib 1153.

The lower rib 1153 may be formed on the lower side of the case 110. The lower rib 1153 may be provided to be connected to the case partition plate 112 provided in the lower portion of the case 110.

The lower rib 1153 may extend from the rear surface of the case 110 toward the bracket panel 130. FIG. 15 illustrates that the lower rib 1153 is provided as a pair, but the number of the lower ribs 1153 is not limited thereto.

For example, a single lower rib 1153 may be provided instead of a plurality of lower ribs 1153, and three or more lower ribs 1153 may be provided.

The lower rib 1153 may be elongated from the upper side to the lower side of the case 110 and thus when the case 110 and the bracket panel 130 are assembled, the lower rib 1153 may maintain a gap between the rear surface of the case 110 and the front surface of the bracket panel 130. That is, the lower rib 1153 may have a shape extending in the vertical direction with respect to the case 110.

However, the shape of the lower rib 1153 may not be limited thereto. For example, the lower rib 1153 may have a shape extending from the left side to the right side of the case 110 and extending in the horizontal direction with respect to the case 110.

The case 110 may include a panel coupling boss 116.

The panel coupling boss 116 may be provided to extend to the rear of the case 110 and penetrate the bracket panel 130.

Particularly, the panel coupling boss 116 may be provided to penetrate a coupling flange of the bracket panel 130. That is, the panel coupling boss 116 may be provided to allow the bracket panel 130 and the case 110 to be screwed together.

The case 110 may include a panel fixing protrusion 117.

The panel fixing protrusion 117 may extend rearward from an inner surface of the case 110. The panel fixing protrusion 117 may be provided to pass through the hole of the bracket panel 130. By inserting the panel fixing protrusion 117 into the hole of the bracket panel 130, the position of the bracket panel 130 may be fixed inside the case 110.

In addition, the panel fixing protrusion 117 may be provided to guide a proper position in which the bracket panel 130 and the case 110 are screwed together.

The case 110 may include a board coupling boss 118.

The board coupling boss 118 may extend rearward from the inner surface of the case 110. The board coupling boss 118 may penetrate the bracket panel 130 so as to allow the circuit board and the case 110 to be screwed together.

In addition, it has been illustrated that the extension rib 115 of the cooking apparatus 1 according to an embodiment includes the upper rib 1151, the middle rib 1152, and the lower rib 1153, but is not limited thereto.

For example, the extension rib 115 may include only the upper rib 1151 and the lower rib 1153.

In this case, when the bracket panel 130 is assembled to the case 110, the upper rib 1151 and the lower rib 1153 may prevent the rear surface of the case 110 and the front surface of the bracket panel 130 from being in contact with each other caused by an external force.

Alternatively, the extension rib 115 may include only the middle rib 1152. In this case, when the bracket panel 130 is assembled to the case 110, the middle rib 1152 may prevent the rear surface of the case 110 and the front surface of the bracket panel 130 from being in contact with each other caused by an external force.

That is, when assembling the bracket panel 130 to the case 110, a part of the case 110 or the bracket panel 130 may be deformed by the assembling force, and the extension rib 115 of the cooking apparatus 1 according to an embodiment may prevent the contact caused by the deformation.

In other words, the extension rib 115 may be provided to maintain a state in which the rear surface of the case 110 is spaced apart from the front surface of the bracket panel 130. Accordingly, the first flow space 160 is secured and thus the moisture introduced into the control unit may be easily discharged to the outside.

In addition, in the control unit 100 of the cooking apparatus 1 according to an embodiment, because the case 110 is injection-formed and the bracket panel 130 is press-formed, the extension rib 115 may be formed on the rear surface of the case 110, thereby reducing manufacturing cost and simplifying the manufacturing process.

However, it is not limited thereto, and thus as long as the extension rib 115 is provided to maintain the state in which the rear surface of the case 110 is spaced apart from the front surface of the bracket panel 130, the extension rib 115 may be formed on the front surface of the bracket panel 130.

The state in which the rear surface of the case 110 is spaced apart from the front surface of the bracket panel 130 by the upper rib 1151 among the extension ribs 115 will be described with reference to FIGS. 16 and 17.

The upper rib 1151 may extend from the rear surface of the case 110 toward the bracket panel 130. By the upper rib 1151, the first flow space 160 may be secured between the rear surface of the case 110 and the front surface of the bracket panel 130.

Accordingly, the extension rib 115 may be arranged inside the first flow space 160.

In addition, the upper rib 1151 may be arranged not to be in contact with the bracket panel 130.

A protruding length d3 of the upper rib 1151 with respect to the rear surface of the case 110 may be approximately 1.1 mm. The separation distance d1 between the rear surface of the case 110 and the front surface of the bracket panel 130 may be approximately 1.3 mm, as shown in FIG. 13.

Therefore, by allowing the length of the upper rib 1151 to be less than the length in the horizontal direction of the first flow space 160, it is possible to easily assembly the case 110 and the bracket panel 130 even if there is an assembly tolerance.

As is apparent from the above description, by discharging moisture introduced into a control unit to the outside, the cooking apparatus may prevent damage to parts caused by the accumulation of moisture.

By providing a guide member that is inclined, the cooking apparatus may prevent moisture from being introduced into a lower side of the guide member and allow the introduced moisture to easily flow.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A cooking apparatus comprising:
a main body including a cooking chamber; and
a control assembly mounted on an exterior of the main body,
wherein the control assembly comprises,
a case,
a suction grille, couplable to an upper portion of the case, and including a cooling air inlet to suction air from an exterior of the cooking apparatus, into the case through the suction grille,
a guide member arranged inside the case and spaced apart from a rear surface of the case, to allow moisture from the suctioned air introduced through the suction grille to flow between the rear surface of the case and the guide member,
a flow space to allow the moisture introduced in the suction grille to flow downward through the guide member,
a circuit board; and
a bracket panel couplable to a lower side of the guide member to allow the circuit board to be mountable to a rear side thereof, the bracket panel arranged spaced apart from a rear surface of the case
wherein
the flow space is formed between a front surface of the bracket panel and the rear surface of the case.

2. The cooking apparatus of claim 1, wherein
the guide member comprises a blocking portion comprising an inclined surface inclined forward and away from an interior of the main body.

3. The cooking apparatus of claim 1, wherein
the case further comprises an extension rib formed to extend from the rear surface of the case toward the bracket panel and arranged inside the flow space.

4. The cooking apparatus of claim 3, wherein
the extension rib comprises at least one of an upper rib formed on an upper side of the case, a lower rib formed on a lower side of the case, and a middle rib formed between the upper rib and the lower rib.

5. The cooking apparatus of claim 1, wherein
the case comprises a case partition plate formed to extend from the rear surface of the case toward the main body.

6. The cooking apparatus of claim 5, wherein
the flow space is a first flow space, and
the control assembly further comprises a second flow space formed between a lower surface of the bracket panel and an upper surface of the case partition plate, the second flow space provided to allow the moisture introduced into the suction grille to flow backward in a direction of the main body.

7. The cooking apparatus of claim 1, wherein
the main body comprises a front plate including
  an opening communicating with the cooking chamber, and
  a mounting portion provided at one side of the opening and to which the control assembly is mounted.

8. The cooking apparatus of claim 7, wherein
the case comprises a case partition plate formed to extend toward the mounting portion of the front plate,
wherein the front plate comprises a guide groove recessed rearward to be spaced apart from the case partition plate so as to allow moisture flowing along the case partition plate to be discharged.

9. The cooking apparatus of claim 7, wherein
the front plate comprises a communicator formed to allow an electronic equipment chamber inside the main body to communicate with the control assembly.

10. The cooking apparatus of claim 7, wherein
the cooling air inlet corresponds to a first cooling air inlet,
wherein the front plate further comprises a second cooling air inlet communicating with the first cooling air inlet to allow air introduced into the first cooling air inlet to flow into an interior of the main body.

11. The cooking apparatus of claim 10, wherein
air introduced into the second cooling air inlet flows into an electronic equipment chamber to cool an circuit board arranged in a rear portion of the control assembly.

12. The cooking apparatus of claim 1, wherein the main body comprises:
  a circulation air intake formed on a lower surface of the main body to allow polluted air to be suction into the main body; and
  a discharge panel detachably mounted on an upper portion of an outer housing of the main body to allow the suctioned polluted air to be filtered and discharged, the discharge panel in which a circulation air outlet is formed,
wherein the suction grille is arranged in front of the discharge panel.

13. The cooking apparatus of claim 12, wherein
the main body further comprises a cooling air outlet formed on an upper surface of the outer housing to allow the air introduced into the cooling air inlet of the suction grille to be discharged.

* * * * *